(12) United States Patent  
Crankshaw (10) Patent No.: US 8,906,722 B2  
(45) Date of Patent: Dec. 9, 2014

(54) PRINTING METHOD FOR USE IN FABRICATION OF AN ELECTRONIC UNIT

(75) Inventor: Mark Crankshaw, Royston (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 13/821,959

(22) PCT Filed: Sep. 6, 2011

(86) PCT No.: PCT/GB2011/001306  
§ 371 (c)(1),  
(2), (4) Date: Mar. 8, 2013

(87) PCT Pub. No.: WO2012/032288  
PCT Pub. Date: Mar. 15, 2012

(65) Prior Publication Data  
US 2013/0168664 A1  Jul. 4, 2013

(30) Foreign Application Priority Data

Sep. 8, 2010  (GB) .................................. 1014897.1

(51) Int. Cl.
| | |
|---|---|
| *H01L 27/32* | (2006.01) |
| *H01L 51/56* | (2006.01) |
| *B41J 3/54* | (2006.01) |
| *H01L 51/00* | (2006.01) |
| *B41J 2/45* | (2006.01) |

(52) U.S. Cl.  
CPC .............. *H01L 51/0005* (2013.01); *B41J 3/543* (2013.01); *H01L 27/3283* (2013.01); *H01L 27/32* (2013.01); *B41J 2/45* (2013.01)  
USPC .............................................. 438/34; 257/88

(58) Field of Classification Search  
USPC .............................................................. 438/35  
See application file for complete search history.

(56) References Cited

U.S. PATENT DOCUMENTS

2003/0087026 A1* 5/2003 Dijksman et al. ............... 427/58  
2005/0093902 A1  5/2005 Kato et al.  
(Continued)

FOREIGN PATENT DOCUMENTS

| EP | 1 647 404 A2 | 4/2006 |
|---|---|---|
| GB | 2 463 670 A | 3/2010 |
| WO | WO-2006/056808 A1 | 6/2006 |
| WO | WO-2006/123167 A1 | 11/2006 |

OTHER PUBLICATIONS

Combined Search and Examination Report for Application No. GB1014897.1, dated Feb. 1, 2011.  
International Preliminary Report on Patentability for Application No. PCT/GB2011/001306, dated Mar. 12, 2013.

*Primary Examiner* — Stephen W Smoot  
(74) *Attorney, Agent, or Firm* — Marshall, Gerstein & Borun LLP (57) ABSTRACT

A printing method for use in fabrication of an electronic unit comprising one or more lines of a regularly repeating structural feature formed over a substrate, the structural feature repeating over a regular interval along each line. The method comprises: using a first print-head arrangement to print portions of a composition at a first pitch along each of the lines; and using a second print-head arrangement to print portions of the composition at a second pitch along each of the lines; such that the first and second pitches together produce a beating pattern along each of the lines, having a beating wavelength matched to the interval of the regularly repeating structural feature.

44 Claims, 10 Drawing Sheets

(56) References Cited

U.S. PATENT DOCUMENTS

| | | |
|---|---|---|
| 2007/0277685 A1 | 12/2007 | James |
| 2008/0291228 A1 | 11/2008 | White et al. |
| 2009/0121618 A1* | 5/2009 | Lyon et al. .................. 313/504 |

OTHER PUBLICATIONS

International Search Report and Written Opinion for Application No. PCT/GB2011/001306, dated Dec. 23, 2011.

* cited by examiner

PRINTING METHOD FOR USE IN FABRICATION OF AN ELECTRONIC UNIT

FIELD OF THE INVENTION

The present invention relates to a printing method for use in fabrication of an electronic unit comprising one or more lines of a regularly repeating structural feature formed over a substrate. For example, the present invention may be used to print an organic layer in an array of opto-electronic components such as the pixels of a display.

BACKGROUND

Techniques are known for forming opto-electronic devices such as light-emitting diodes (LEDs) over a substrate. Supported on the substrate, each such device comprises a layer of electroluminescent material disposed between two electrodes referred to as the anode and cathode. The device may also comprise a charge injection layer and/or a charge transport layer disposed between the electroluminescent layer and one of the electrodes. In modern devices, the electroluminescent layer, charge injection layer and/or charge transport layer may be formed of an organic polymer. An LED comprising one or more such organic layers may be referred to as an organic LED (OLED). In a particular application, an array of these constituent devices may be formed over a substrate such as glass or plastic in order to produce a unit such as an electronic display screen for a computer, television, mobile terminal or other appliance.

Figure 1:
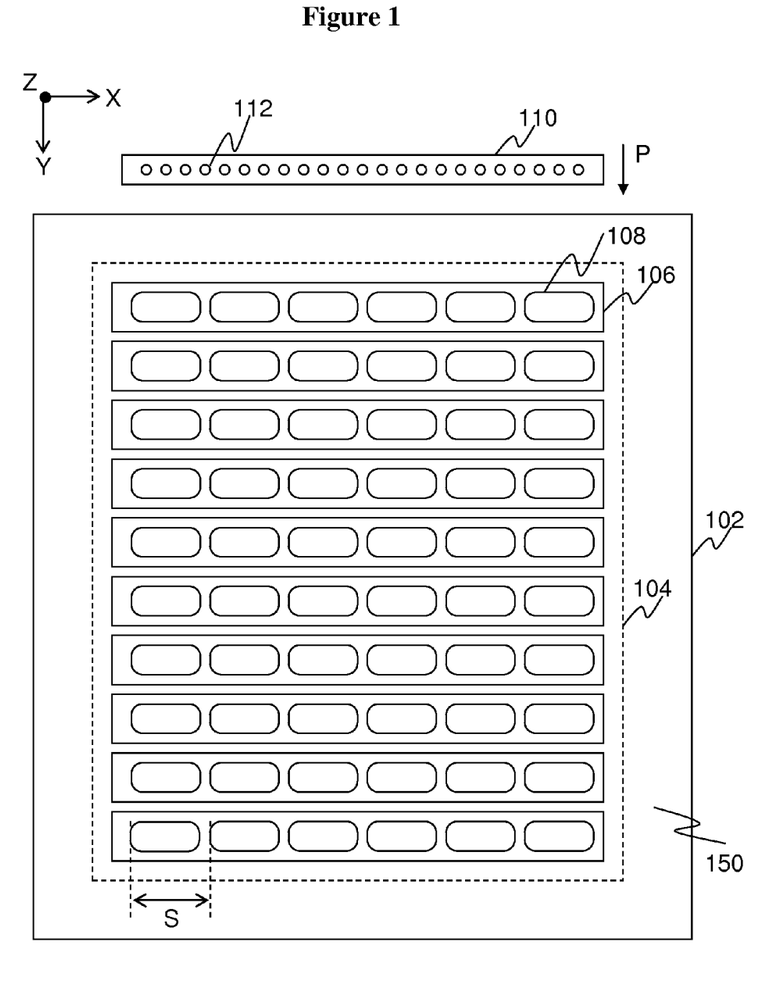
FIG. 1 shows a schematic top-down view of an example display panel at an intermediate stage of production.

FIG. 1 shows a schematic top-down view of an exemplary display panel. The display panel comprises a substrate 102 having an array area 104 in which the pixels of the display are formed. Within the array area 104 are defined a plurality of structural lines in the form of channel regions 106. Each line or channel region 106 comprises a row of smaller pixel regions 108 formed at regular intervals along the length of the channel region 106. The substrate 102 and array area 104 are typically both square or rectangular shaped, in the same orientation, hence defining perpendicular axes X and Y in the horizontal and vertical directions of the array area as shown, with the mutually perpendicular Z axis being perpendicular to the plane of the substrate 102 and array area 104 (i.e. out of the page). In this case the pixel regions 108 are typically arranged in rows along the horizontal length of the array area (the X direction) and columns along its vertical length (the Y direction). In the example shown the channel regions 106 have a longitudinal direction which extends across the horizontal length of the array area 104 (in the X direction). The pixel regions 108 themselves each also have a longitudinal axis aligned with their respective channel 106, each being longer in the direction along the channel 106 than in the direction perpendicular to the channel 106.

Figure 2:
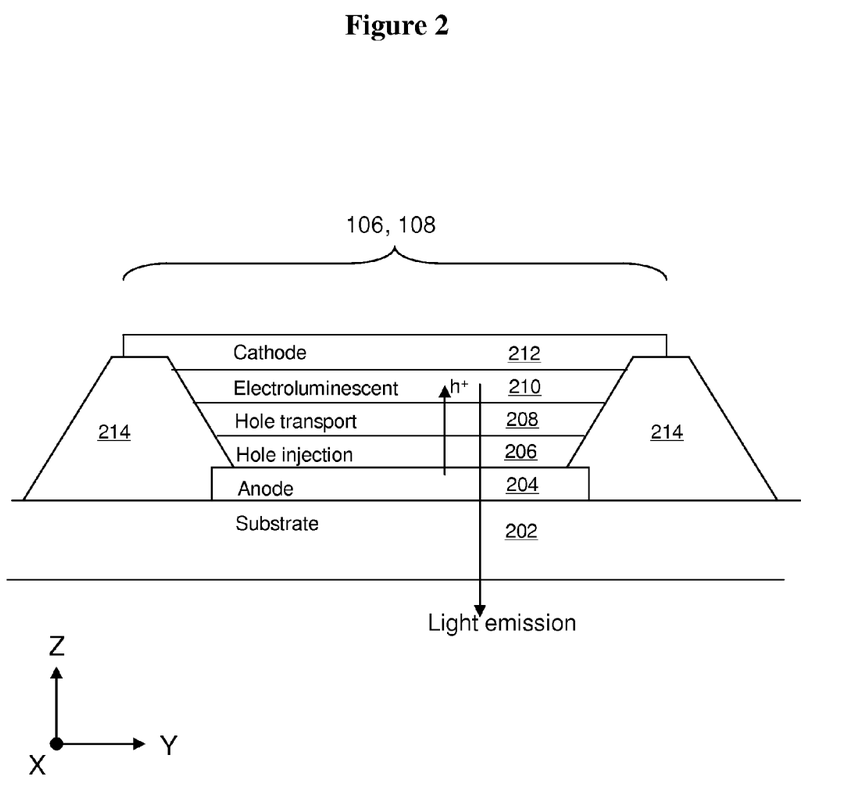
FIG. 2 shows a schematic side cross-section through the layers of an example light-emitting device such as an OLED.

FIG. 2 shows a schematic side cross-section through the layers of an exemplary light-emitting device such as an OLED, which may be formed in a pixel region 108 of a display panel. The method of forming the panel begins by providing a substrate 202 and then forming portions of anode material 204 over the substrate 202. Preferably the substrate 202 is formed of a transparent material such as glass or a suitable plastic, and the anode 204 is formed of a transparent conductor such as indium tin oxide (ITO), such that the light can be emitted through the substrate 202.

Each channel region 106 may be defined by a longitudinal well formed over the substrate 102 in the array area 104 (running in the X direction in the example of FIG. 1). In this case, each well is formed by banks of a separating material 214 such as photoresist defining the sides of the well, and a strip of the anode material 204 at the base of the well. Each channel region 106 has a structurally recurring feature along its length which defines the separate component pixel regions 108, e.g. a repeated tapering and/or break in the well at regular points along its length (i.e. at periodic X coordinates in the example of FIG. 1). In the pixel regions 108 of the well, a hole injection layer 206 is then formed over the anode 204, a hole transport layer 208 is formed over the hole injection layer, a semiconducting electroluminescent layer 210 is formed over the hole transport layer 208, and a cathode 212 is formed over the electroluminescent layer 210.

In operation of the finished device, when a suitable potential difference is applied between the anode 204 and cathode 212, holes ($h^+$) are injected into the device from the anode 104 and electrons ($e^-$) are injected from the cathode 212. The holes and electrons combine in the electroluminescent layer 210 to cause an excitation which then decays to emit light. Injection of the holes from the anode 204 is assisted by the hole injection layer 206, and transport of the holes from the anode 204 to the electroluminescent layer 210 is assisted by the hole transport layer 208.

Alternative arrangements are also possible, for example with a cathode formed over the substrate and the anode as the top electrode, and/or comprising an electron injection layer and electron transport layer between the cathode and an electroluminescent layer.

As mentioned, each of the hole injection layer 206, hole transport layer 208 and/or electroluminescent layer 210 may be formed of an organic polymer. An advantage of organic polymer layers is that they can be deposited by solution-processing of a film-forming polymer material, allowing low cost manufacturing and better control over the deposition process. The technique involves applying a solution containing the desired polymer material to the relevant surface, then drying off the solvent by evaporation or other such drying technique, thereby leaving a film of the remaining polymer material. Advantages of organic polymers along with some suitable solutions and deposition techniques are discussed in international patent application publication no. WO 2006/123167.

For forming the hole injection layer 206, the solute used may be a hole-injecting material comprising an "active" component doped with a typically larger amount of host "matrix" component. The active component is that actually chosen for its ability to promote hole injection, whilst the matrix component is a charge balancing counterion. One particular example of a hole-injecting material disclosed in WO 2006/123167 is PEDOT: PSS. That is, an active component of polyethylene-dioxythiophene ("PEDOT" or sometimes just "PEDT") doped with a matrix component of polystyrene sulfonate ("PSS"). The PSS is soluble in water so as to produce a solution suitable for deposition techniques. Recently there have been provided alternative hole-injection materials other than PEDOT:PSS. For example, Plextronics produce a range of materials referred to as "PLEX" comprising a sulfonated polythiophene derivative as an active component and poly-(4-vinylphenol) (PVPh) as a matrix component. Unlike PEDOT:PSS, an additional solvent such as diethylene glycol is used in the deposition solution.

One technique that can be used for depositing features of the panel such as the organic layer(s) 206, 208, 210 is inkjet printing, e.g. using inks comprising solutions of organic conducting or semiconducting polymers to deposit the organic layers. Note that ink in this context does not necessarily imply colouring, but rather can refer to any solution that can be printed and then dried in order to deposit the solute.

To this end, a print-head 110 may be provided comprising a row of nozzles 112. The row of nozzles is oriented parallel with the direction of the channel regions 106 (the X direction in FIG. 1), and the print-head 110 and substrate 102 move relative to one another so as to perform a printing pass in a print direction P transverse to the channel regions 106 (i.e. moving in the Y direction in FIG. 1). Moving relative to the substrate 102 in this manner, the print-head 110 thus prints into each channel region 106 in succession. Further, the nozzles 112 are spaced with a regular spacing along the row, preferably with multiple nozzles per pixel region 108. Thus as the print-head 110 moves over each successive channel 106 in turn, it prints multiple drops of the organic ink into each pixel region 108 of the respective channel 106 simultaneously.

SUMMARY

There is a problem with the above-described arrangement in that the ends of the longitudinal pixel regions 108 may not properly "wet out" when printed with the organic ink. That is to say, the drops of ink may not flow over the full surface of the pixel region 108 before drying, but may instead leave uncovered areas at the pixel ends. For illustrative purposes an example of this problem is discussed in relation to FIGS. 3 and 4.

Figure 3:
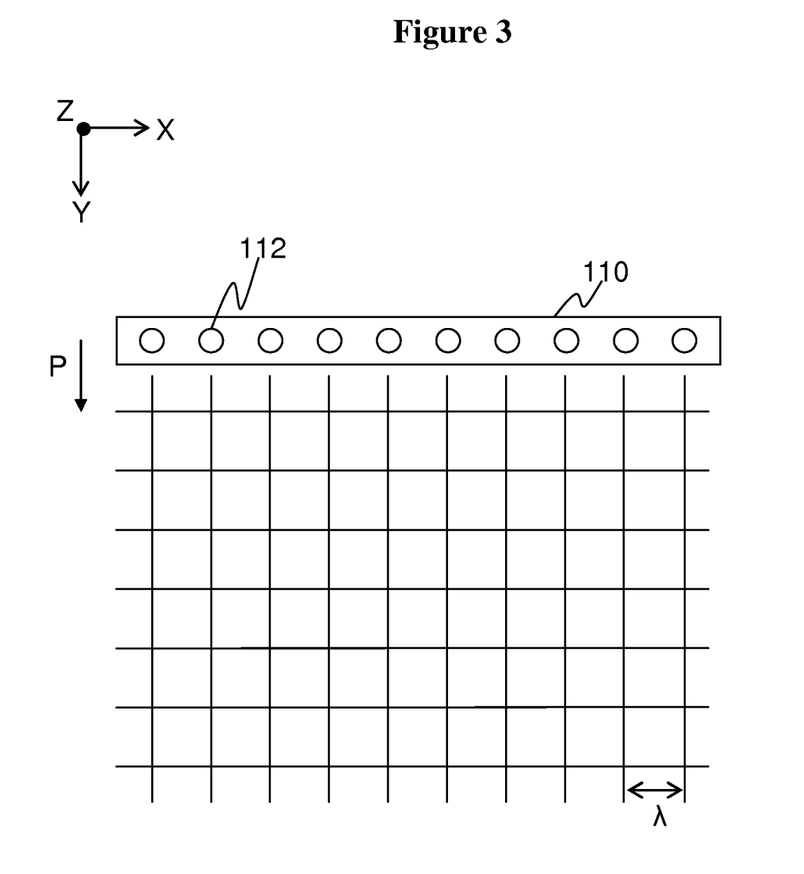
FIG. 3 shows a grid of potential printing locations of a print-head arrangement, FIG. 4 schematically illustrates a step-by-step process of forming an organic layer in pixel regions of an example display panel.

General inkjet systems use a fixed rectangular grid of potential drop locations as shown schematically in FIG. 3. The spacing of the grid transverse to the print direction (the print "pitch" $\lambda$) is determined by the spacing of the nozzles 112, and the spacing of the grid along the print is determined by the speed of relative movement between the head 112 and the substrate 102 and the rate of drop production (the jetting frequency).

Figure 4:
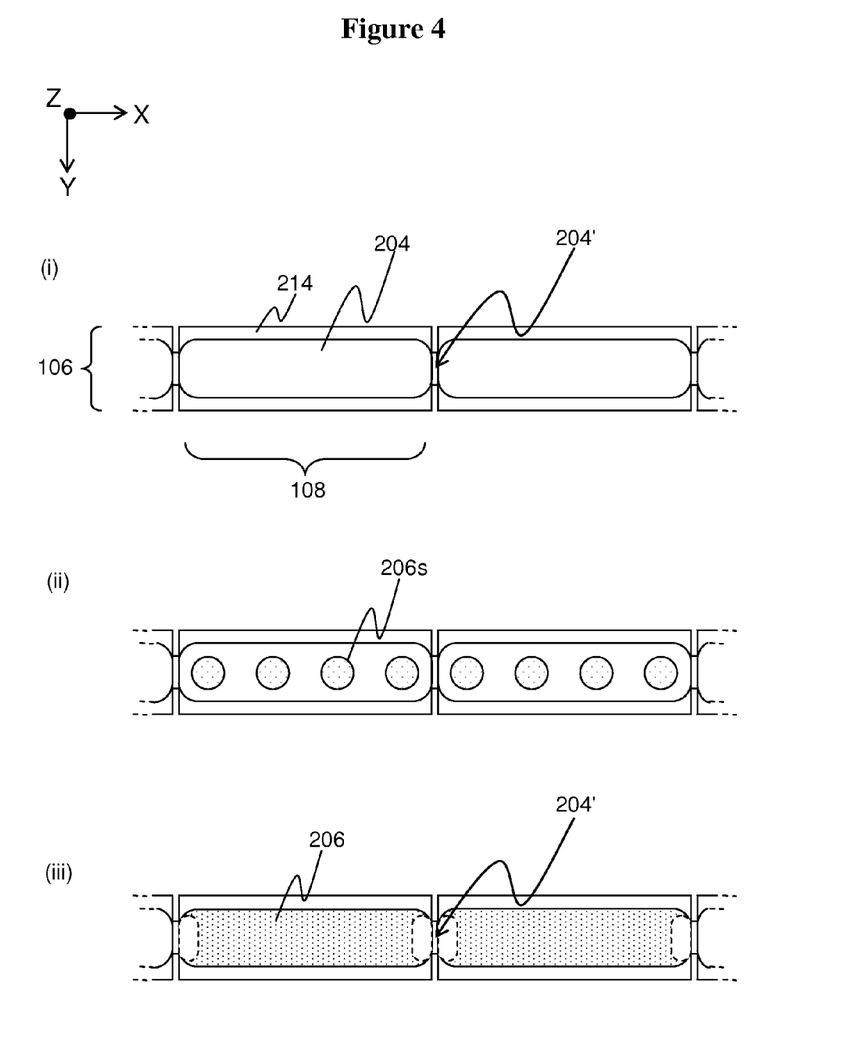

Referring to the example of FIG. 4, a method of printing the organic hole injection layer 206 may begin at step (i) by providing a substrate of the kind discussed above, having regularly repeating pixel regions 108 formed along channel regions 106. The channels 106 are defined by longitudinal wells formed of photoresit banks 214 and an anode base 204. The boundaries between the constituent pixel regions 108 are defined by "break regions" 204' in the resist 214. These break regions are points occurring regularly along the channel 106 where the resist material 214 tapers so as to form a narrowing of the well, then becomes discontinuous before widening back out again (although the anode material 204 preferably remains continues along the channel 106). Thus each pixel region 108 is bounded on two opposing sides by resist banks 214 and on its longitudinal ends by two opposing break regions 204'.

At step (ii), when the print-head 110 moves to a position over a particular channel region 106, it prints drops of ink 206s in parallel from a plurality of nozzles 112 over multiple pixels along the channel 106. The ink 206s comprises a solution of organic polymer which will form the hole injection layer 206 over the anode base 204. The spacing of the nozzles 112 results in drops of ink 206s being printed at a certain print "pitch" $\lambda$ (i.e. a certain special frequency) along the direction of the channel 106. The nozzles 112 are spaced with a higher density (smaller spacing) than the pixel regions 208, such that multiple drops are printed in parallel into each pixel region 208, along the longitudinal axis of the pixel at the print pitch $\lambda$.

However, the break regions 204' can be difficult to wet out with the organic ink 206s. That is, the drops of ink 206s may not fully flow over the surface of the pixel region 108 before drying. When the ink 206s dries at step (iii), parts of the underlying anode 204 may therefore be left uncovered by the hole injection layer material 206. When the hole transport layer 208 and electroluminescent layer 210 are subsequently deposited on top of the hole injection layer 206 (e.g. usually also by inkjet printing) they tend to follow the shape of the hole injection layer 206. However, the cathode 212 may be patterned more indiscriminately, e.g. by means of a shadow mask, which means that the cathode 212 may short through and create electrical contact with the anode 204. This will lead to device failure.

Similar problems with wetting can occur when printing into any regularly recurring regions of an electronic unit.

To address this type of problem, it would be desirable to achieve some degree of non-uniformity in the print density so as to provide regular local increases in print density. That is, it may be desirable to print a higher density of drops 206s in certain areas, i.e. so that the grid of potential drop locations is not equally spaced. For example this would make it possible to manipulate film profiles in pixels or to force pixel regions 208 to wet out with the fluid ink 206s. As mentioned, the 'break' regions 204' can be difficult to wet with printed ink 206s and so printing more drops in the break regions may help wet out the channel.

Generally in display printing and other functional printing the substrate is often structured with regular features, and so other applications will also exist where it would be advantageous to print over patterned areas using a varying drop density with a regular repeat.

In the print direction this can be achieved by varying the relative head-substrate speed or the drop production rate. However, transverse to the print direction P where the pitch $\lambda$ is determined by the nozzle spacing, this is difficult to alter. In the above example, it may be desired to deposit a higher density of drops in the break regions 204', which would require effectively varying the nozzle pitch.

Figure 5:
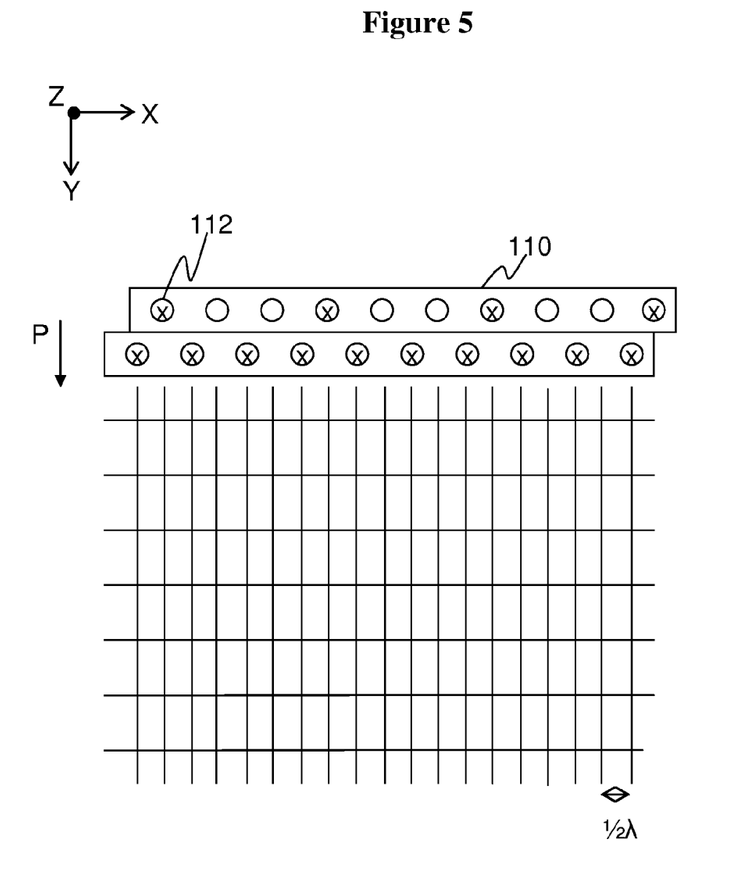
FIG. 5 shows a grid of potential printing locations of a system of print-heads.

One solution would be to perform a second print pass with a sideways offset, and then just print extra drops 206s from certain nozzles passing over the breaks during the second print pass. However a second pass makes the print process much slower. Alternatively, one or more additional print heads 110 could be added to form an assembly, with the nozzles 112 from the two heads being offset from one another so that the effective nozzle pitch of the assembly is reduced. This is illustrated schematically in FIG. 5, showing a finer grid of potential drop locations achieved by two horizontally offset print-heads. However, this would mean that only some of the nozzles of the second print-head would be used—those marked "x" in FIG. 5, which are the nozzles coinciding with the break regions 204' at the pixel edges. However, this means some of the nozzles 112 of the second head would be left redundant at the centre of the pixel, which is wasteful. That is, since the example of FIGS. 4 and 5 only requires a higher drop density at the breaks 204', then only a few of the nozzles added by the additional head(s) will actually be used. This adds unwanted expense to the print system. A similar solution would be simply to increase the resolution of the nozzle array 112 but then only use certain nozzles at this resolution, which again means some nozzles 112 would be left redundant.

It would therefore be desirable to find an alternative solution.

According to one aspect of the present invention there is provided a printing method for use in fabrication of an electronic unit comprising one or more lines of a regularly repeating structural feature formed over a substrate, the structural feature repeating over a regular interval along each line; wherein the method comprises: using a first print-head arrangement to print portions of a composition at a first pitch along each of said lines; and using a second print-head arrangement to print portions of said composition at a second pitch along each of said lines; such that the first and second pitches together produce a beating pattern along each of said lines, having a beating wavelength matched to the interval of said regularly repeating structural feature.

By printing with two or more different print-head arrangements, each having a different print pitch transverse to the print direction, a vernier-type pattern can be printed which 'beats' due to the different pitches. This gives local print density enhancement on a third pitch (derived from the two underlying print pitches) which can be matched to the pitch of features on a substrate with a structured pattern (e.g. pixels on a display substrate). For example see the drops 206*s* illustrated schematically in FIG. 8(*ii*). Hence a higher print density can be achieved in regions which will benefit from such, for example at the ends of pixels 208. The beating pattern advantageously allows the material to be printed with a varying density along the channel region as appropriate to the repeating structure of that channel region. Making use of a Vernier-type pattern from two print-head arrangements with different pitches thus advantageously achieves the periodic local increased resolution without having redundant nozzles. That is, the present invention allows a repeating spatial variation in print density so as to be able to use a high density in some regions without unnecessarily providing a high density everywhere which would involve undesirable redundancy.

In embodiments, a plurality of said lines may each be formed in a longitudinal direction over the substrate, the first and second print-head arrangements may move in a print direction relative to the substrate, and the print direction may be transverse to the longitudinal direction of said lines.

The first print-head arrangement may comprise a first instance of a print-head having a row of regularly spaced nozzles each for printing a respective portion of said composition at a different respective point along each of said lines; and the second print-head arrangement may comprise a second instance of said print-head positioned at an oblique angle with respect to the first instance, the second pitch relative to the first pitch being a result of the nozzle spacing and said oblique angle.

The second instance of the print-head may comprise a separate print-head used together in a same printing pass across the substrate as the first instance.

The second instance of the print-head may comprise the same print-head used in a subsequent printing pass across the substrate.

In other embodiments, the one or more lines may be formed in a longitudinal direction over the substrate, and the first and second print-head arrangements may each move in a print direction relative to the substrate, and the print direction may be parallel to the longitudinal direction of said lines.

The second print-head arrangement may comprise one or more nozzles configured with a different jetting frequency than the first print-head arrangement, resulting in said first and second pitches as the one or more nozzles move along the longitudinal direction of said lines.

The regularly repeating structural feature may correspond to an opto-electronic component, such that each of said lines may comprise a line of regularly repeating opto-electronic regions formed over said substrate, and each of the first and second print-head arrangements may be used to print a plurality of portions of said composition into each opto-electronic region at the respective pitch along each line.

The electronic unit may comprise an electronic display, the regularly repeating structural feature may correspond to a pixel of the display such that each of said lines may comprise a row of regularly repeating pixel regions formed in a longitudinal direction over said substrate, and each of the first and second print-head arrangements may be used to print a plurality of portions of said composition into each pixel region at the respective pitch along the longitudinal direction of each row.

Said composition may comprise a solution of organic polymer for depositing a layer of the organic polymer along each of said lines.

The layer of organic polymer may comprise one of a charge-carrier injection layer, a charge-carrier transport layer, and an electroluminescent layer.

Said composition may be printed by inkjet printing.

Each of said lines may comprise a well region having a regularly repeating structural feature formed in a longitudinal direction over said substrate, and each of the first and second print-head arrangements may be used to print a plurality of portions of said composition into each well region at the respective pitch along its longitudinal direction.

Each of said well regions may be formed by banks of photoresist running along said longitudinal direction over said substrate.

Each of said lines may comprise an electrode layer formed over said substrate, and each of the first and second print-head arrangements may be used to print the portions of said composition over the electrode layer.

The electrode layer may be an anode layer formed of indium tin oxide.

The substrate may comprise glass or transparent plastic.

The first and second pitches may have a relative ratio of 5:4.

The first pitch may be substantially equal to 70 μm and the second pitch may be substantially equal to 56 μm.

According to another aspect of the present invention, there is provided a computer program product for use in fabrication of an electronic unit comprising one or more lines of a regularly repeating structural feature formed over a substrate, the structural feature repeating over a regular interval along each line; wherein the computer program product comprises code embodied on a computer-readable medium and configured so as when executed on a processor to: control a first print-head arrangement to print portions of a composition at a first pitch along each of said lines; and control a second print-head arrangement to print portions of said composition at a second pitch along each of said lines; such that the first and second pitches together produce a beating pattern along each of said lines, having a beating wavelength matched to the interval of said regularly repeating structural feature.

In embodiments, the code may be further configured to control the print-head arrangements in accordance with any of the above method features.

According to another aspect of the invention, there is provided a printing apparatus for use in fabrication of an electronic unit comprising one or more lines of a regularly repeating structural feature formed over a substrate, the structural feature repeating over a regular interval along each line; wherein the apparatus comprises: a first print-head arrangement configured to print portions of a composition at a first pitch along each of said lines; and a second print-head arrangement configured to print portions of said composition at a second pitch along each of said lines; such that the first and second pitches together produce a beating pattern along each of said lines, having a beating wavelength matched to the interval of said regularly repeating structural feature.

In embodiments, the printing apparatus may be further configured to perform operations in accordance with any of the above method features.

According to another aspect of the invention, there is provided an electronic unit comprising: one or more lines of a regularly repeating structural feature formed over a substrate, the structural feature repeating over a regular interval along each line; and a material deposited at both a first and a second pitch so as to form a beating pattern having a beating wavelength matched to the interval of said regularly repeating structural feature.

In embodiments, the electronic unit may comprise structural features resulting from any of the above method features.

DETAILED DESCRIPTION OF PREFERRED EMBODIMENTS

As discussed above, in display printing (and indeed other functional printing), the substrate is usually structured with regular features and so that there may exist patterned areas where higher drop density is desirable with a regular repeat. The following describes an example of how a regularly repeating pattern of varying drop density can be achieved by superimposing the print locations from two or more print heads (or assemblies) of fixed nozzle spacing, allowing the spatial nozzle frequencies to 'beat' together to produce a beat wavelength which corresponds with the desired variation of drop density on the substrate.

An example will now be discussed with reference to FIGS. 1, 6, 7 and 8. Referring again to FIG. 1, the pixel regions 108 have a structure which repeats over a regular interval S along the direction of each channel 106 (the X direction transverse to the direction of printing Y in FIG. 1). The term "interval" is used herein to refer to the regular length or distance S over which a structural feature repeats, i.e. the spatial period of the feature. In this example, the repeating feature comprises a break region 204' in the well of each channel 106. According to one particularly advantageous application of the present invention, it is desired to achieve a higher drop density in or around the break regions 204' whilst only printing with a lower drop density towards the middle of the pixel regions 208.

In the context of printing, the term "pitch" may be used to refer to the spatial period or regular spacing of printed portions of the composition being printed, i.e. the drop spacing.

According to the following embodiment of the present invention, the varying drop density within each channel region 106 is achieved by using a first print-head arrangement to print the organic ink 206s at a first pitch $\lambda_1$ along the channel 106 (corresponding to a spatial frequency $v_1$) and using a second print-head arrangement to print the ink 206s at second pitch $\lambda_2$ along the channel 106 (corresponding to a spatial frequency $v_2$).

Figure 6:
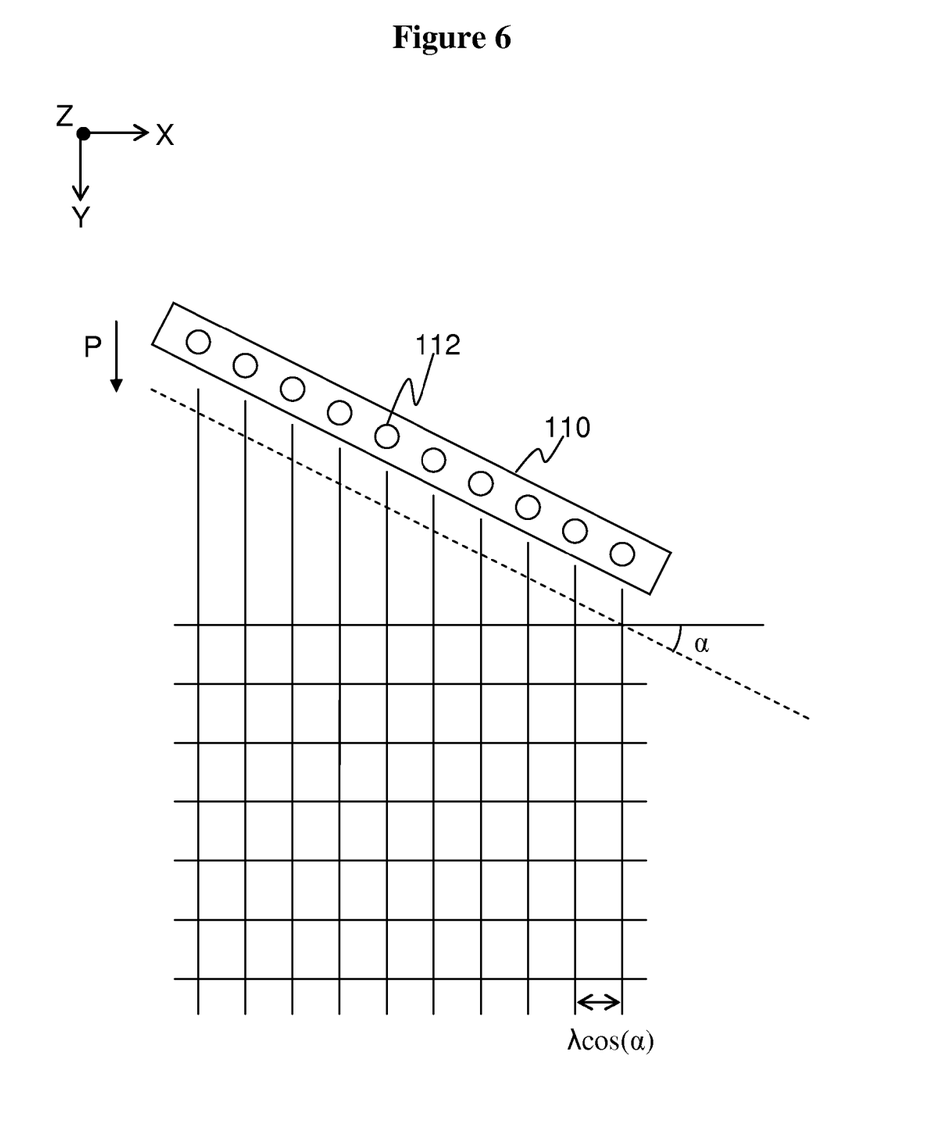
FIG. 6 shows a grid of potential printing locations of another print-head arrangement.
Figure 7:
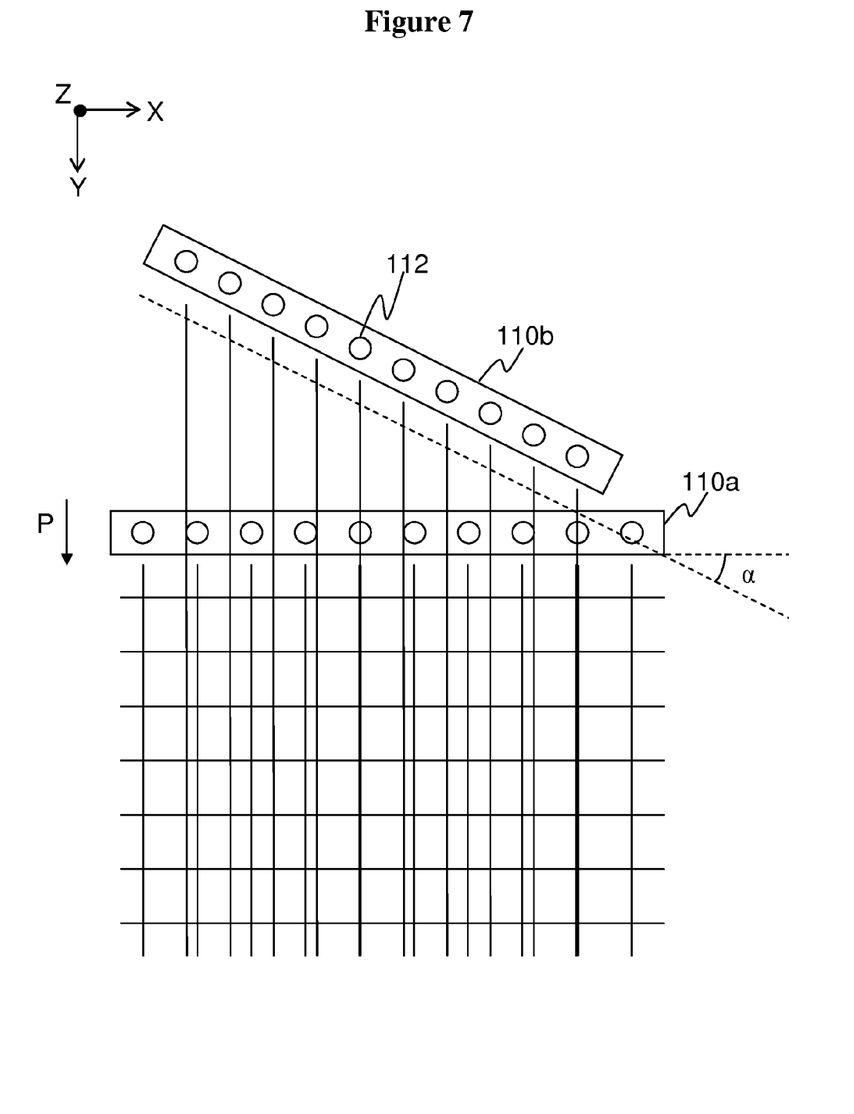
FIG. 7 shows a grid of potential printing locations of another system of print-heads, FIG. 8 schematically illustrates another step-by-step process of forming an organic layer in pixel regions of an example display panel.

One preferred way to achieve a second pitch $\lambda_2$ relative to the first pitch $\lambda_1$ is illustrated schematically in FIGS. 6 and 7. According to this technique, a first print-head 110a is provided in a substantially similar arrangement to that described in relation to FIGS. 1 and 3 above. A second print-head 110b is also provided comprising the same row of fixed-spacing nozzles 112 as the first print-head 110b, but oriented at an oblique angle α relative to the first print-head 110a. If the first print-head 110a has a "natural" pitch of $\lambda_1=\lambda$ when oriented in parallel with the channel regions 106 (i.e. both the row of nozzles 112 and channels 106 run in the X direction in FIG. 1), then the second print-head 110b will have an effective pitch $\lambda_2=\lambda \cos(\alpha)$ when turned to an oblique angle α relative to the longitudinal direction of the channels 106 and first print-head 110a. Thus a non-uniform grid of potential drop locations is achieved. More generally, both the print-heads could be angled relative to the longitudinal direction of the channel regions 106 so as to achieve any two effective pitches.

The two print-heads 110a and 110b in the two different orientations preferably move together relative to the substrate as part of the same overall print-head assembly, both printing into each successive channel region 106 as the assembly passes in a print direction transverse to the longitudinal direction of the channel regions 106, in the same print pass over the substrate 102.

The drops of the two pitches are thus superimposed along the same channel 106 so as to create a beating pattern, sometimes referred to as a Vernier effect. In this application, the effect occurs because at regular points along the channel 106 the drops 206s from the two pitches coincide constructively so as to result in a higher print density. At other points the drops from the two pitches do not coincide and so result in a lower density. The distance or interval over which the beating repeats is the beating wavelength $\lambda_3$ (corresponding to a third spatial frequency $v_3$). The beat equation is:

$$v_3=|v_1-v_2|$$

or:

$$\lambda_3 = \frac{1}{\lambda_1} + \frac{1}{\lambda_2}$$

According to the preferred application of the present invention, the beating wavelength $\lambda_3$ is matched to the interval S over which the pixel structure repeats, such that the higher density points are aligned with the break regions 204' between pixels 108. Hence more drops are printed into or around the break regions 204' than elsewhere within the pixel regions 108.

Note that beating only occurs when one pitch is not an integer multiple of the other (nor vice versa). Hence the example of FIG. 5 is not considered beating.

Figure 8:
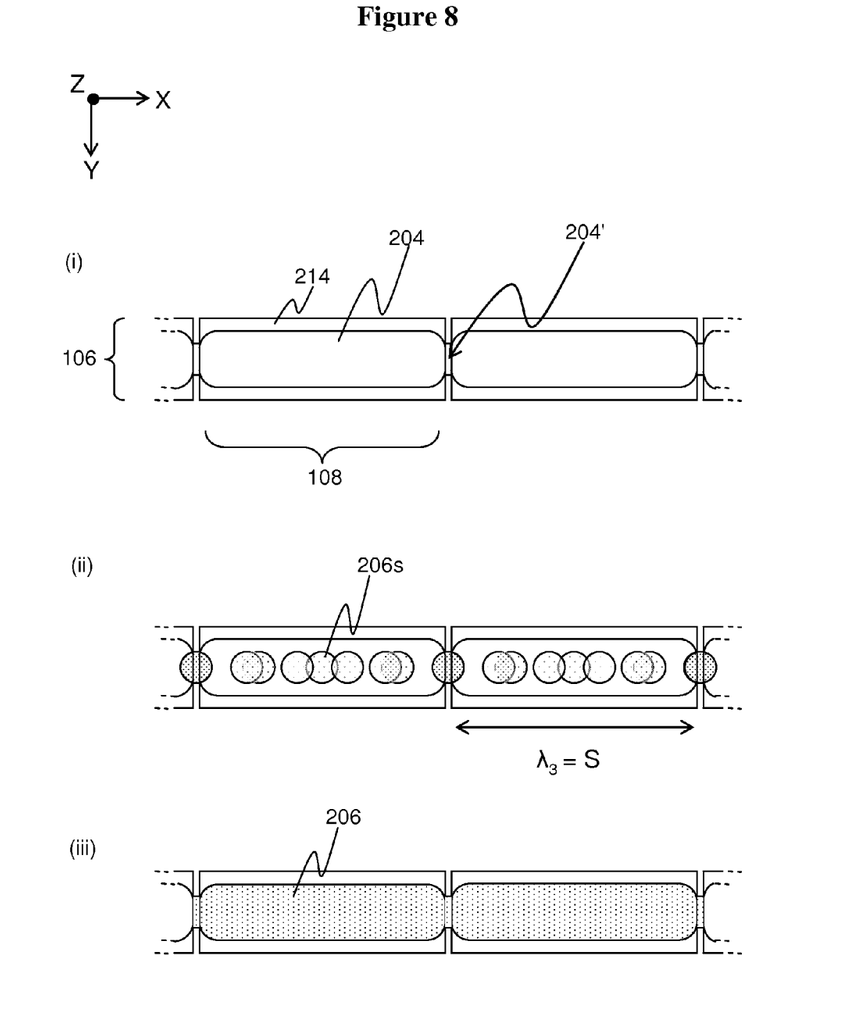

A particularly advantageous application of the beating effect is illustrated schematically in FIG. 8. The method begins at step (i) by providing a substrate 102 with channel regions 106 and pixel regions 108 defined as discussed above. At step (ii) the first and second print-heads 110a and 110b move together over a particular channel 106 and both print ink drops 206s along that same channel 106 with their respective pitches $\lambda_1$ and $\lambda_2$ creating a beating pattern with beating wavelength $\lambda_3$ and with coincident drops from the two pitches being printed at the break regions 204'. An advantageous result of this technique is then realised when the ink drops 206s fully wet out over the pixel region 108, even around the break regions 204', so that when the ink dries at step (iii) then no portion of the underlying anode material 204 is left exposed by the hole injection layer 206.

For example, if the pixel region 108 is twenty arbitrary units long, the first pitch is four arbitrary units (corresponding to a spatial frequency of five drops per pixel region 108), and the second pitch is five arbitrary units (corresponding to four drops per pixel region 108); then the beating wavelength will be four lots of five arbitrary units, i.e. twenty arbitrary units, such that the pattern will repeat once per pixel region 108.

In one particular example, the length S of each pixel 108 is 270 μm. In that case the required beat wavelength is also 270 μm and if the first print-head 110a has a nozzle pitch (wavelength) of 70 μm, the second wavelength can be calculated as 56 μm. As discussed, this nozzle pitch could be achieved by angling another 70 μm pitch head/array.

FIG. 8(ii) shows the location of drops 206s which would be printed from nozzle arrays of pitch 70 and 56 μm. This shows high drop density from near-coincident drops over the breaks 204'.

An arrangement of heads based on this system, possibly even incorporating beating of more than two frequencies, has the potential to provide higher drop densities where needed on a substrate with periodic features but without needing multiple passes or the redundancy resulting from a full high density array. This could significantly reduce the number of heads required in a large print head array for display printing.

Note that although the invention preferably results in more uniform wetting out of the ink 206s in the pixel regions 108, a fingerprint of the technique may still remain in a finished product. For example, sometimes additional "dummy" drops are printed onto the substrate in a dummy area 150 outside of the main array area 104 (so that certain undesirable edge effects are not incurred in the actual pixels 108 themselves). In this dummy area 150 the beating pattern may remain visible since the drops are not printed into any particular well or receptacle region as they are in pixel regions 108, and so do not necessarily flow together into an indistinguishably uniform deposit.

The motion of the print-heads will preferably be controlled by means of a computer program embodied on a computer-readable storage medium such as an optical disc, magnetic storage medium or flash memory, and arranged for execution on a computer connected to a suitable peripheral mechanism for moving the print-heads 110a and 110b relative to the substrate 102. Where it is said that the print-head moves relative to the substrate, this does not necessarily mean the print-head moves in an absolute sense relative to the lab. The relative movement of the print-head could either be due to the print-head moving over the substrate whilst the position of the substrate is fixed, or the substrate moving beneath print-head whilst the position of the print-head is fixed, or indeed due to both items moving.

It will be appreciate that the above embodiments have been described only by way of example.

For instance, the invention could use more than two pitches to create a more complex beating pattern. Further, instead of angling the print-heads 110a and 110b relative to one another, an alternative arrangement would be to use a second print-head 110b with a different natural pitch than the first print-head 110a (i.e. different nozzle spacing). In another variation, rather than using two print heads 110a and 110b together in the same printing pass, it would be possible to print using the same print-head 110 first at one angle in a first printing pass across the substrate 102 and then again at another angle in a second printing pass (although this variant is less preferred due to being slower).

Figure 9:
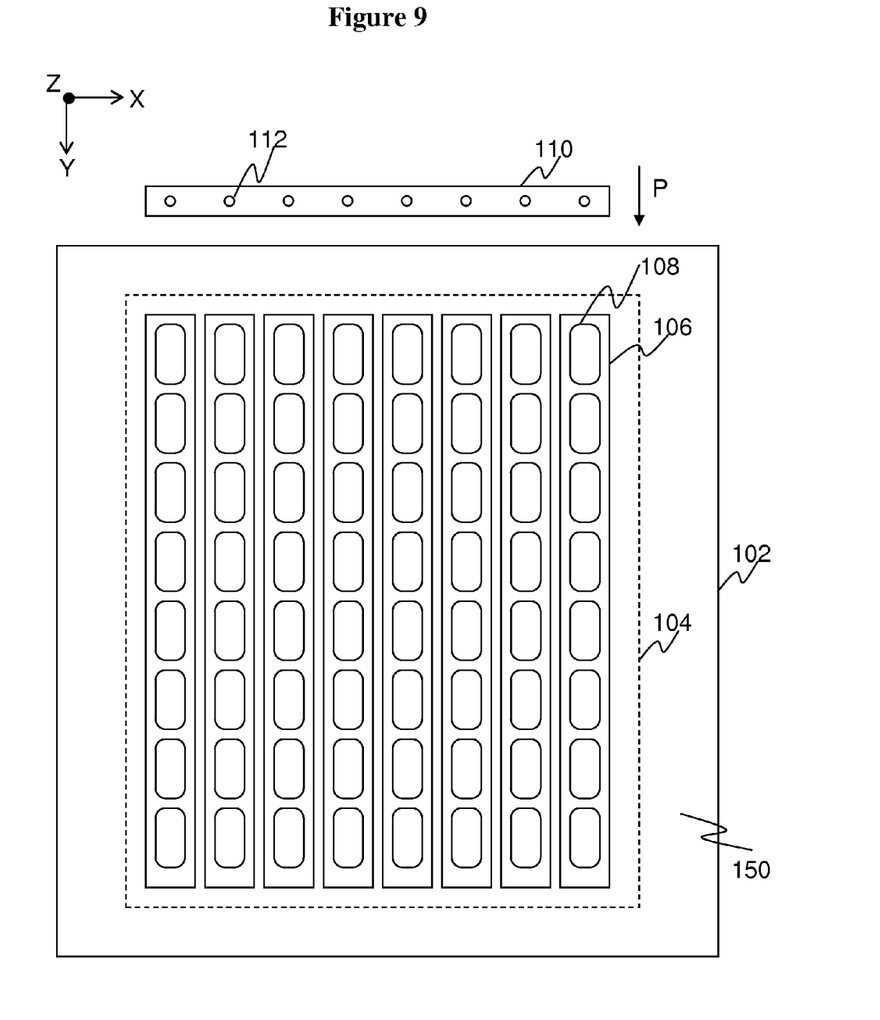
FIG. 9 shows a schematic top-down view of another example display panel at an intermediate stage of production, and FIG. 10 gives a schematic illustration of a further system of print-heads.
Figure 10:
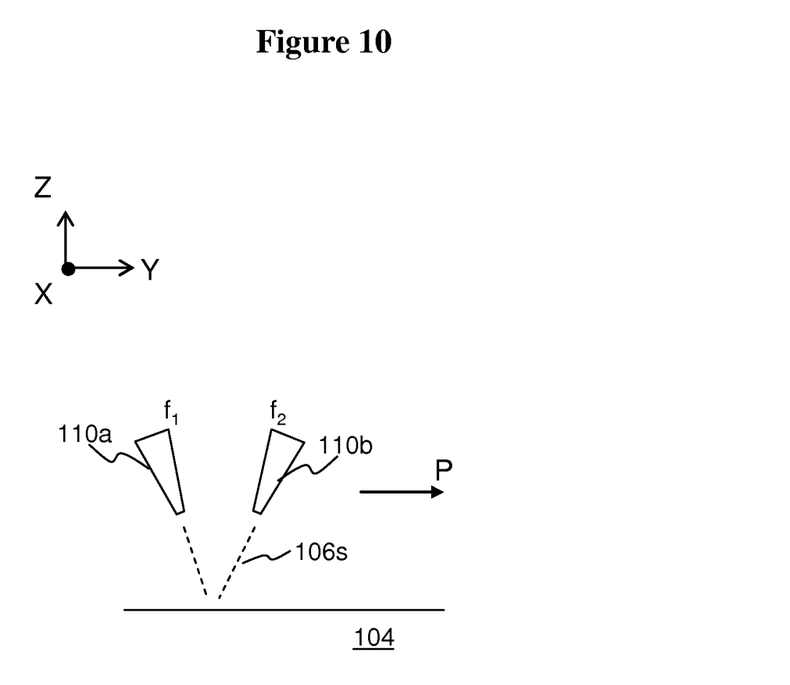

A further variation is shown schematically in FIGS. 9 and 10. Here, the channel regions 106 run in columns in the vertical direction of the substrate 102 and array area 104, rather than rows. That is, channel regions 106 have their longitudinal direction running in parallel with the print direction P. In this case, the first print-head arrangement 110a comprises one or more nozzles 112 configured to print portions of the ink 206s at a first temporal frequency $f_1$ (i.e. first jetting frequency), and the second print-head arrangement 110b comprises a second print-head arrangement configured to print portions of the ink 206s at a second temporal frequency $f_2$ (i.e. second jetting frequency). If the first and second print-heads move together at a fixed speed, this will result in two different fixed pitches $\lambda_1$ and $\lambda_2$ having values set by the print speed and temporal jetting frequencies. Hence a similar kind of beating pattern will result along the channels 106.

For the ITO/anode 204, it is possible to provide channels either with or without a break—the figures illustrate a line bank structure without a break in the ITO, but the method of printing described in the invention could equally be applied to, for example, a full active matrix backplane where anode, ITO and bank are all structured to give fully isolated individual pixels driven individually by underlying TFT circuits or such like.

Further, the channels 106 need not necessarily be defined by a resist pattern or well region. For example the channels 106 could be printed onto a channel defined simply by a line of electrode material 204. The term "channel" could mean generally any path, line or course in which regularly repeating structural feature is formed along a direction in the plane of the substrate.

Furthermore, the present invention is not limited to printing the hole injection layer of OLEDs. Alternatively or additionally for example, the present invention could be used to print other organic layers such as a hole transport layer 208 and/or electroluminescent layer 210, or more generally any organic charge-injection layer, charge-carrier transport layer and/or electroluminescent layer or light sensing layer. E.g. some simpler devices may be formed without a hole transport layer and/or transport layer, and may only comprise an electroluminescent layer, or may alternatively or additionally comprise electron transport or injection layers. Further, arrays of light sensing devices can be formed in a similar manner with a layer of organic light-sensing semiconductor formed between two electrodes (in some cases the only difference between an LED and a light sensor is that the device is connected in the opposite bias).

Even more generally, the present invention could be applied to any other electronic device with a regular structure in which varying print density is desirable, e.g. light sensor arrays, TFTs, or grid or bus lines of any circuit such as that of a solar panel. For example other kinds of features can be formed by inkjet printing, e.g. using a metal ink comprising a solution of metal nanoparticles for printing electrode features or other metal features. The present invention is not limited to the particular inks mentioned above but can be used to create a periodic variation in the print density of any composition which can be printed in the fabrication of an electronic unit of any kind.

Note also that the term electronic "unit" does not limit to a completed end-user product, but could instead refer to a component to be supplied to a manufacturer of a display product, e.g. a constituent panel to be incorporated into a product.

Other variants or applications of the invention may become apparent to a person skilled in the art given the disclosure hereon. The invention is not limited by the described embodiments but only by the appendant claims.

The invention claimed is:

1. A printing method for use in fabrication of an electronic unit comprising one or more lines of a regularly repeating structural feature formed over a substrate, the structural feature repeating over a regular interval along each line, wherein the method comprises:
   using a first print-head arrangement to print portions of a composition at a first pitch along each of said lines; and
   using a second print-head arrangement to print portions of said composition at a second pitch along each of said lines;
   wherein the first and second pitches are different, and are arranged to provide that the first pitch is not an integral multiple of the second pitch or vice versa, such that the first and second pitches together produce a beating pattern along each of said lines, having a beating wavelength matched to the interval of said regularly repeating structural feature.

2. The method of claim 1, wherein a plurality of said lines are each formed in a longitudinal direction over the substrate, and the first and second print-head arrangements move in a print direction relative to the substrate, the print direction being transverse to the longitudinal direction of said lines.

3. The method of claim 1, wherein the one or more lines are formed in a longitudinal direction over the substrate, and the first and second print-head arrangements each move in a print direction relative to the substrate, the print direction being parallel to the longitudinal direction of said lines.

4. The method of claim 3, wherein the second print-head arrangement comprises one or more nozzles configured with a different jetting frequency than the first print-head arrangement, resulting in said first and second pitches as the one or more nozzles move along the longitudinal direction of said lines.

5. The method of claim 1, wherein the regularly repeating structural feature corresponds to an opto-electronic component, such that each of said lines comprises a line of regularly repeating opto-electronic regions formed over said substrate, and each of the first and second print-head arrangements is used to print a plurality of portions of said composition into each opto-electronic region at the respective pitch along each line.

6. The method of claim 1, wherein the electronic unit comprises an electronic display, the regularly repeating structural feature corresponds to a pixel of the display such that each of said lines comprises a row of regularly repeating pixel regions formed in a longitudinal direction over said substrate, and each of the first and second print-head arrangements is used to print a plurality of portions of said composition into each pixel region at the respective pitch along the longitudinal direction of each row.

7. The method of claim 1, wherein said composition comprises a solution of organic polymer for depositing a layer of the organic polymer along each of said lines.

8. The method of claim 7, wherein the layer of organic polymer comprises one of a charge-carrier injection layer, a charge-carrier transport layer, and an electroluminescent layer.

9. The method of claim 1, comprising printing said composition by inkjet printing.

10. The method of claim 1, wherein each of said lines comprises a well region having a regularly repeating structural feature formed in a longitudinal direction over said substrate, and each of the first and second print-head arrangements is used to print a plurality of portions of said composition into each well region at the respective pitch along its longitudinal direction.

11. The method of claim 10, wherein each of said well regions is formed by banks of photoresist running along said longitudinal direction over said substrate.

12. The method of claim 1, wherein each of said lines comprises an electrode layer formed over said substrate, and each of the first and second print-head arrangements is used to print the portions of said composition over the electrode layer.

13. The method of claim 12, wherein the electrode layer is an anode layer formed of indium tin oxide.

14. The method of claim 1, wherein the substrate comprises glass or transparent plastic.

15. The method of claim 1, wherein the first and second pitches have a relative ratio of 5:4.

16. The method of claim 1, wherein the first pitch is substantially equal to 70 µm and the second pitch is substantially equal to 56 µm.

17. A printing method for use in fabrication of an electronic unit comprising one or more lines of a regularly repeating structural feature formed over a substrate, the structural feature repeating over a regular interval along each line, wherein the method comprises:
   using a first print-head arrangement to print portions of a composition at a first pitch along each of said lines; and
   using a second print-head arrangement to print portions of said composition at a second pitch along each of said lines;
   such that the first and second pitches together produce a beating pattern along each of said lines, having a beating wavelength matched to the interval of said regularly repeating structural feature, wherein:
   the first print-head arrangement comprises a first instance of a print-head having a row of regularly spaced nozzles each for printing a respective portion of said composition at a different respective point along each of said lines; and
   the second print-head arrangement comprises a second instance of said print-head positioned at an oblique angle with respect to the first instance, the second pitch relative to the first pitch being a result of the nozzle spacing and said oblique angle.

18. The method of claim 17, wherein the second instance of the print-head comprises a separate print-head used together in a same printing pass across the substrate as the first instance.

19. The method of claim 17, wherein the second instance of the print-head comprises the same print-head used in a subsequent printing pass across the substrate.

20. A computer program product for use in fabrication of an electronic unit comprising one or more lines of a regularly repeating structural feature formed over a substrate, the structural feature repeating over a regular interval along each line; wherein the computer program product comprises code embodied on a computer-readable medium and configured so as when executed on a processor to:
   control a first print-head arrangement to print portions of a composition at a first pitch along each of said lines; and control a second print-head arrangement to print portions of said composition at a second pitch along each of said lines;

wherein the first and second pitches are different, and are arranged to provide that the first pitch is not an integral multiple of the second pitch or vice versa, such that the first and second pitches together produce a beating pattern along each of said lines, having a beating wavelength matched to the interval of said regularly repeating structural feature.

21. The computer program product of claim 20, wherein a plurality of said lines are each formed in a longitudinal direction over the substrate, wherein the code is further configured to control the print-head arrangements to move in a print direction relative to the substrate, the print direction being transverse to the longitudinal direction of said lines.

22. Printing apparatus for use in fabrication of an electronic unit comprising one or more lines of a regularly repeating structural feature formed over a substrate, the structural feature repeating over a regular interval along each line, wherein the apparatus comprises:

a first print-head arrangement configured to print portions of a composition at a first pitch along each of said lines; and a second print-head arrangement configured to print portions of said composition at a second pitch along each of said lines, the second pitch being different from the first pitch;

wherein the first and second print-head arrangements are configured to provide that the first pitch is not an integral multiple of the second pitch or vice versa, such that the first and second pitches together produce a beating pattern along each of said lines, having a beating wavelength matched to the interval of said regularly repeating structural feature.

23. The printing apparatus of claim 22, wherein a plurality of said lines are each formed in a longitudinal direction over the substrate, and the first and second print-head arrangements are each configured to move in a print direction relative to the substrate, the print direction being transverse to the longitudinal direction of the lines.

24. The printing apparatus of claim 22, wherein:

the first print-head arrangement comprises a first instance of a print-head having a row of regularly spaced nozzles each for printing a respective portion of said composition at a different respective point along each of said lines; and the second print-head arrangement comprises a second instance of said print-head positioned at an oblique angle with respect to the first instance, the second pitch relative to the first pitch being a result of the nozzle spacing and said oblique angle.

25. The printing apparatus of claim 22, wherein the regularly repeating structural feature corresponds to an opto-electronic component, such that each of said lines comprises a line of regularly repeating opto-electronic regions formed over said substrate, and each of the first and second print-head arrangements is configured to print a plurality of portions of said composition into each opto-electronic region at the respective pitch along each line.

26. The printing apparatus of claim 22, wherein the electronic unit comprises an electronic display, the regularly repeating structural feature corresponds to a pixel of the display such that each of said lines comprises a row of regularly repeating pixel regions formed in a longitudinal direction over said substrate, and each of the first and second print-head arrangements is configured to print a plurality of portions of said composition into each pixel region at the respective pitch along the longitudinal direction of each row.

27. The printing apparatus of claim 22, wherein each of the first and second print-head arrangements is configured to print a composition comprising a solution of organic polymer for depositing a layer of the organic polymer along each of said lines.

28. The printing apparatus of claim 22, wherein each of said first and second print-head arrangements comprises an inkjet print-head for printing said composition by inkjet printing.

29. The printing apparatus of claim 22, wherein each of said lines comprises a well region having a regularly repeating structural feature formed in a longitudinal direction over said substrate, and each of the first and second print-head arrangements is configured to print a plurality of portions of said composition into each well region at the respective pitch along its longitudinal direction.

30. The printing apparatus of claim 22, wherein each of said lines comprises an electrode layer formed over said substrate, and each of the first and second print-head arrangements is configured to print the portions of said composition over the electrode layer.

31. The printing apparatus of claim 22, wherein the first and second print-head arrangements are configured such that the first and second pitches have a relative ratio of 5:4.

32. The printing apparatus of claim 22, wherein the first print-head arrangement is configured with the first pitch being substantially equal to 70 μm, and the second print-head arrangement is configured with the second pitch being substantially equal to 56 μm.

33. An electronic unit comprising:

one or more lines of a regularly repeating structural feature formed over a substrate, the structural feature repeating over a regular interval along each line; and a material deposited at both a first and a second pitch that is different from the first pitch, the first and second pitches being arranged to provide that the first pitch is not an integral multiple of the second pitch or vice versa, such that the first and second pitches together form a beating pattern along each of said lines, having a beating wavelength matched to the interval of said regularly repeating structural feature.

34. The electronic unit of claim 33, wherein the regularly repeating structural feature corresponds to an opto-electronic component, such that each of said lines comprises a line of regularly repeating opto-electronic regions formed over said substrate.

35. The electronic unit of claim 33, wherein the electronic unit comprises an electronic display, and the regularly repeating structural feature corresponds to a pixel of the display such that each of said lines comprises a row of regularly repeating pixel regions formed in a longitudinal direction over said substrate.

36. The electronic unit of claim 33, wherein said material comprises an organic polymer.

37. The electronic unit of claim 36, wherein the organic polymer comprises one of a charge-carrier injection material, a charge-carrier transport material, and an electroluminescent material.

38. The electronic unit of claim 33, wherein each of said lines comprises a well region having a regularly repeating structural feature formed in a longitudinal direction over said substrate.

39. The electronic unit of claim 38, wherein each of said well regions is formed by banks of photoresist running along said longitudinal direction over said substrate.

40. The electronic unit of claim 39, wherein each of said lines comprises an electrode layer formed over said substrate.

41. The electronic unit of claim 40, wherein the electrode layer is an anode layer formed of indium tin oxide.

42. The electronic unit of claim 33, wherein the substrate comprises glass or transparent plastic.

43. The electronic unit of claim 33, wherein the first and second pitches have a relative ratio of 5:4.

44. The electronic unit of claim 33, wherein the first pitch is substantially equal to 70 μm and the second pitch is substantially equal to 56 μm.

* * * * *